United States Patent
Subramanian et al.

(10) Patent No.: US 9,230,825 B2
(45) Date of Patent: Jan. 5, 2016

(54) METHOD OF TUNGSTEN ETCHING

(71) Applicant: Lam Research Corporation, Fremont, CA (US)

(72) Inventors: Ramkumar Subramanian, Fremont, CA (US); Anne Le Gouil, Fremont, CA (US); Yoko Yamaguchi, Union City, CA (US)

(73) Assignee: Lam Research Corporation, Fremont, CA (US)

( * ) Notice: Subject to any disclaimer, the term of this patent is extended or adjusted under 35 U.S.C. 154(b) by 238 days.

(21) Appl. No.: 13/889,282

(22) Filed: May 7, 2013

(65) Prior Publication Data

US 2014/0120727 A1  May 1, 2014

Related U.S. Application Data

(60) Provisional application No. 61/719,814, filed on Oct. 29, 2012.

(51) Int. Cl.
| | |
|---|---|
| *H01L 21/3065* | (2006.01) |
| *H01L 21/3213* | (2006.01) |
| *C23F 4/00* | (2006.01) |
| *H01L 21/308* | (2006.01) |

(52) U.S. Cl.
CPC ............ *H01L 21/32136* (2013.01); *C23F 4/00* (2013.01); *H01L 21/3086* (2013.01); *H01L 21/30655* (2013.01)

(58) Field of Classification Search
None
See application file for complete search history.

(56) References Cited

U.S. PATENT DOCUMENTS

| | | | | |
|---|---|---|---|---|
| 4,992,136 | A  * | 2/1991 | Tachi et al. | 438/695 |
| 5,702,983 | A  * | 12/1997 | Shinohara | 438/628 |
| 6,461,974 | B1 * | 10/2002 | Ni et al. | 438/712 |
| 6,746,961 | B2 * | 6/2004 | Ni et al. | 438/700 |
| 8,609,546 | B2 * | 12/2013 | Lee et al. | 438/706 |
| 2003/0092280 | A1 * | 5/2003 | Lee et al. | 438/720 |
| 2003/0235995 | A1 * | 12/2003 | Oluseyi et al. | 438/710 |
| 2011/0151670 | A1 * | 6/2011 | Lee et al. | 438/695 |
| 2011/0244686 | A1 * | 10/2011 | Aso et al. | 438/694 |

* cited by examiner

*Primary Examiner* — Anita Alanko
(74) *Attorney, Agent, or Firm* — Beyer Law Group LLP

(57) ABSTRACT

A method for etching a tungsten containing layer in an etch chamber is provided. A substrate is placed with a tungsten containing layer in the etch chamber. A plurality of cycles is provided. Each cycle comprises a passivation phase for forming a passivation layer on sidewalls and bottoms of features in the tungsten containing layer. Additionally, each cycle comprises an etch phase for etching features in the tungsten containing layer.

14 Claims, 13 Drawing Sheets

METHOD OF TUNGSTEN ETCHING

CROSS-REFERENCE TO RELATED APPLICATIONS

This application claims priority under 35 U.S.C. §119 from U.S. Provisional Patent Application No. 61/719,814, filed Oct. 29, 2012, entitled METHOD OF HIGH ASPECT RATIO TUNGSTEN ETCHING USING SIDEWALL PASSIVATION/DEPOSITION AND ETCHING FOR CD, PROFILE AND LOADING CONTROL UTILIZING THE MIXED MODE PULSING (MMP) PROCESS which is incorporated herein by reference for all purposes.

FIELD OF THE INVENTION

The invention relates to a method of forming semiconductor devices on a semiconductor wafer. More specifically, the invention relates to etching features in a tungsten-containing layer during the formation of semiconductor devices on a semiconductor wafer.

SUMMARY OF THE INVENTION

To achieve the foregoing and in accordance with the purpose of the present invention, a method for etching a tungsten containing layer in an etch chamber is provided. A substrate is placed with a tungsten containing layer in the etch chamber. A plurality of cycles is provided. Each cycle comprises a passivation phase for forming a passivation layer on sidewalls and bottoms of features in the tungsten containing layer. Additionally, each cycle comprises an etch phase for etching features in the tungsten containing layer.

In another manifestation of the invention, a method for forming a passivation layer on sidewalls of etched tungsten features is provided. Etched features having sidewalls are formed in a tungsten layer of a wafer. A halogenated silicon precursor is adsorbed to the sidewalls. The silicon precursor adsorbed to the sidewalls is oxygenated.

These and other features of the present invention will be described in more details below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

Figure 1:
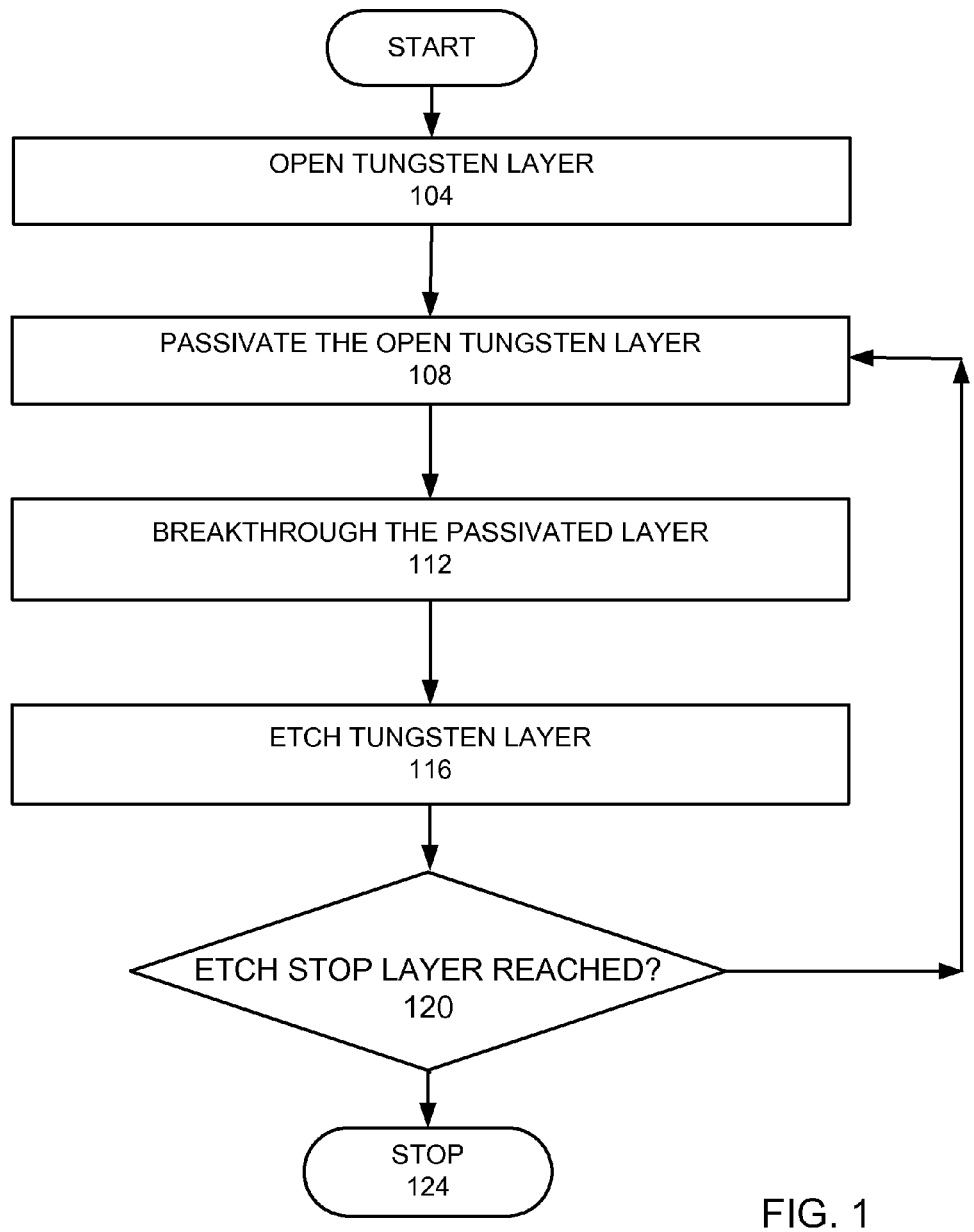
FIG. 1 is a flow chart of an embodiment of the invention.

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Methods are provided for forming passivation layers on the sidewalls of features of a tungsten layer on a wafer. In particular, a silicon precursor is adsorbed onto the sidewalls of features etched in tungsten. The silicon precursor is then oxygenated, which forms a passivation layer composed of silicon oxide. As such, the sidewalls of the etched tungsten features may have a passivation layer composed of silicon oxide. Further, methods discussed may also form a passivation layer on the bottoms of the features, which may be removed using a breakthrough process.

Passivation layers may be used to etch high aspect ratio features into layers on wafers. In particular, passivation layers may be formed on sidewalls of features. In particular, passivation layers may be used on features having sidewalls and at least one open front. An open front is an exposed area of a layer on a wafer that is to be etched. The open front may be bare, comprising only the material of the layer on the wafer itself. Alternatively, the open front may be modified, having a chemistry that is influenced by treatments used on the open portion of the layer on the wafer.

Sidewalls having a passivation layer may be etched more slowly than an open front of the feature. As such, sidewalls having a passivation layer may be used in high aspect ratio etching where the depth of a feature may be much greater than the width of the feature. A first embodiment of a mixed mode pulsing (MMP) process to be employed for etching a tungsten or tungsten containing layer includes three steps: passivation, breakthrough, and main etch. A second embodiment of a MMP process involves two steps: passivation and main etch. In the second embodiment, a sufficient bias is used in the main etch to effectively breakthrough portions of a passivation layer covering the bottom of etched tungsten features.

In both embodiments, a passivation layer is formed on exposed areas of etched tungsten features. Exposed areas may include sidewalls and bottoms. Once the passivation layer is formed, a breakthrough process may occur in a second step. During the breakthrough process, the bottoms of the features are opened. In particular, the bottoms of the features are opened when the portions of the passivation layer that cover the bottoms of the etched features are removed. Once the bottoms of the features are opened, they are able to be etched. At the same time, the portions of the passivation layer covering the sidewalls remain intact, leaving the sidewalls protected from etching. In a third step, the features are etched. In particular, an etching gas is provided to react with the open front on the bottoms of the features. Since the sidewalls of the features are protected by passivation layers, the etching of the features is preferentially towards the deepening of the feature.

FIG. 1 is a high level flow chart of an embodiment of the invention. In this embodiment, a tungsten layer is opened (step 104). Further, a series of passivation-etching steps are performed. The series of passivation-etching steps may be repeated cyclically until a predetermined etch stop layer has been reached. Initially, the open tungsten layer is passivated (step 108). In particular, a passivation layer is formed on exposed areas of the open tungsten layer. Exposed areas are formed by the etching of features into the tungsten layer.

Additionally, there is a breakthrough step (step 112) where portions of the passivation layer are removed. For example, the portions of the passivation that cover bottoms of etched features may be removed. More generally, areas of the etched features that are desired to be etched further may have the portions of the passivation layer that cover those areas removed. Further, there is an etching step (step 116) where the tungsten layer is etched. In particular, the areas of the etched features that are desired to be etched may be etched.

Once the passivation-etching steps 108, 112, and 116 have been performed, there is determination of whether an etch stop layer has been reached (step 120). If there is a determination that the etch stop layer has been reached, the process stops (step 124). However, if there is a determination that the etch stop layer has not been reached, then the process cycles back to the beginning of the passivation-etching steps, starting at step 108.

EXAMPLE

Figure 3A:
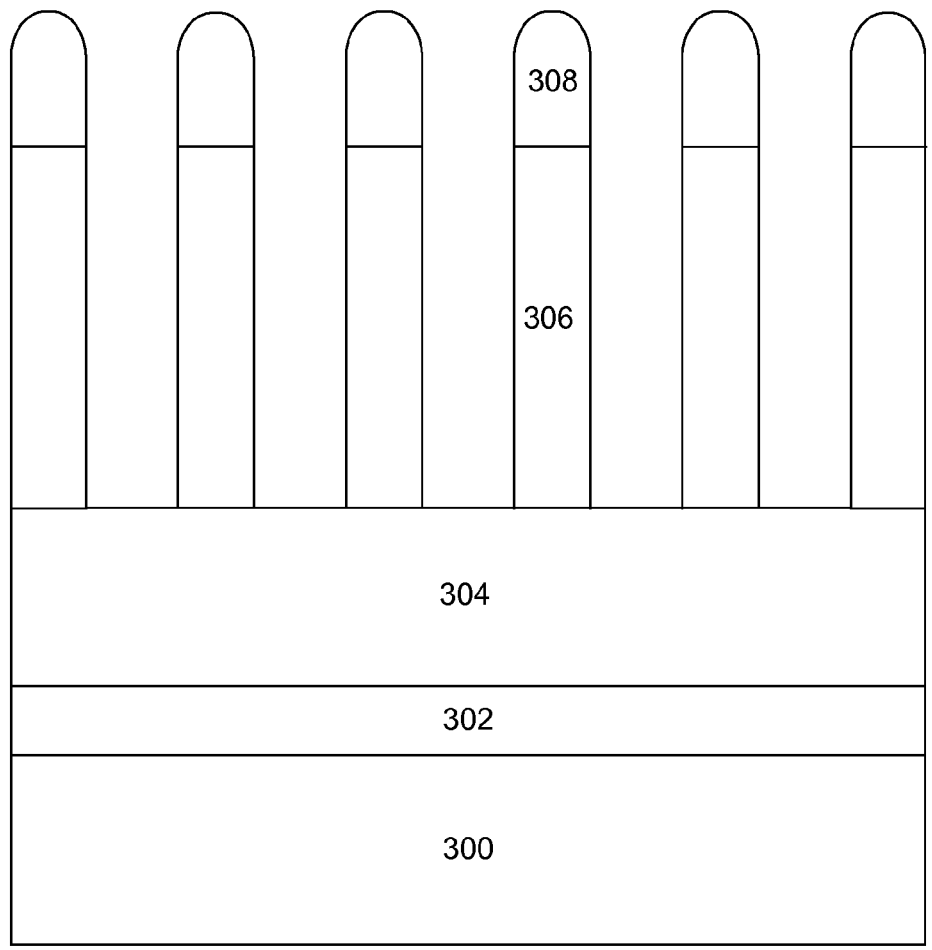
FIGS. 3A-3I illustrate a stack processed in accordance with an embodiment of the present invention.

In an embodiment of the invention, an exemplary method for etching a tungsten containing layer is provided. Initially, a substrate with a tungsten layer disposed under a mask is provided. Accordingly, FIG. 3A illustrates an unetched tungsten layer on a wafer, in accordance with embodiments of the present invention. In particular, FIG. 3A includes substrate 300, etch stop layer 302, tungsten layer 304, first mask 306, and second mask 308.

Figure 4:
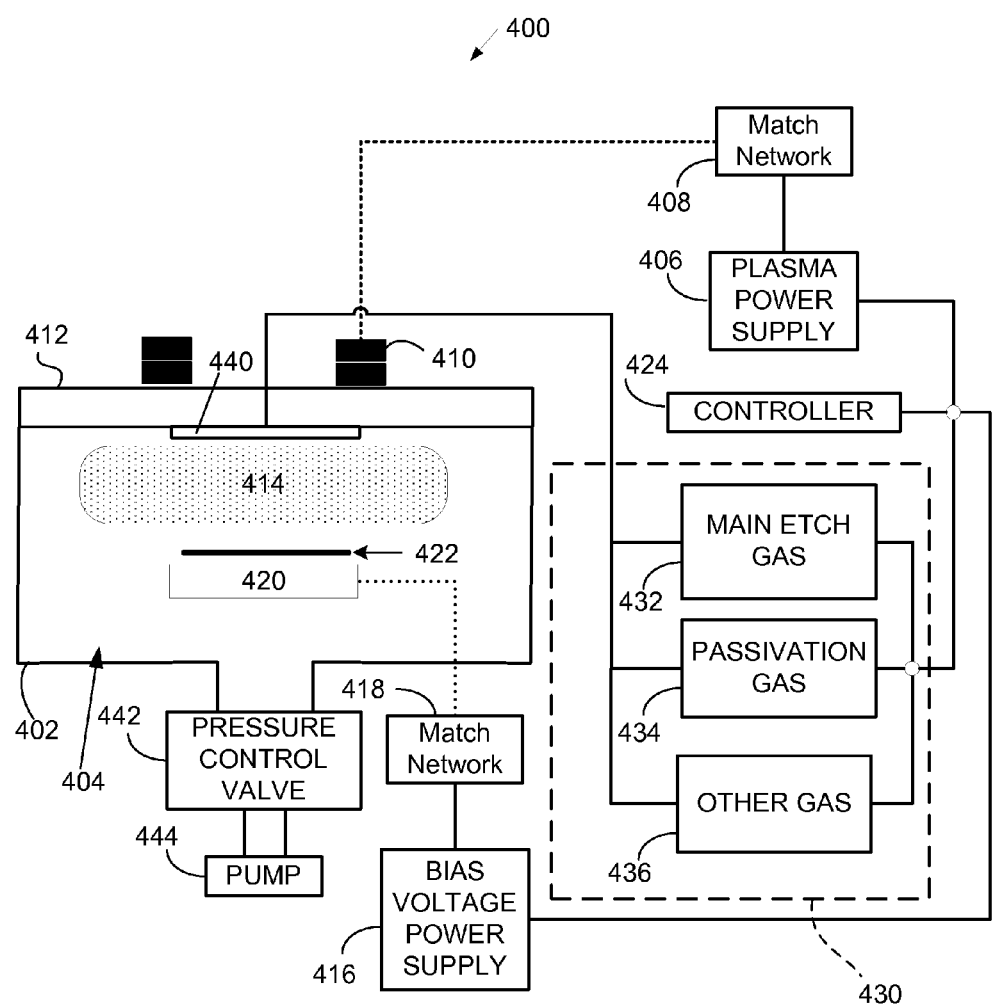
FIG. 4 illustrates a schematic view of a plasma processing chamber, in accordance with embodiments of the present invention.

The substrate is placed in an etch chamber. FIG. 4 schematically illustrates an example of a plasma processing system 400 which may be used to perform the process of etching tungsten layers on wafers in accordance with one embodiment of the present invention. The plasma processing system 400 includes a plasma reactor 402 having a plasma processing chamber 404 therein. A plasma power supply 406, tuned by a match network 408, supplies power to a TCP coil 410 located near a power window 412 to create a plasma 414 in the plasma processing chamber 404 by providing an inductively coupled power. The TCP coil (upper power source) 410 may be configured to produce a uniform diffusion profile within plasma processing chamber 404. For example, the TCP coil 410 may be configured to generate a toroidal power distribution in the plasma 414. The power window 412 is provided to separate the TCP coil 410 from the plasma chamber 404 while allowing energy to pass from the TCP coil 410 to the plasma processing chamber 404. A wafer bias voltage power supply 416 tuned by a match network 418 provides power to an electrode 420 to set the bias voltage on a wafer 422 which is supported by the electrode 420. A controller 424 sets points for the plasma power supply 406 and the wafer bias voltage supply 416.

The plasma power supply 406 and the wafer bias voltage power supply 416 may be configured to operate at specific radio frequencies such as, for example, 13.56 MHz, 27 MHz, 2 MHz, 400 kHz, or combinations thereof. Plasma power supply 406 and wafer bias power supply 416 may be appropriately sized to supply a range of powers in order to achieve desired process performance. For example, in one embodiment of the present invention, the plasma power supply 406 may supply the power in a range of 300 to 10000 Watts, and the wafer bias voltage power supply 416 may supply a bias voltage of in a range of 10 to 1000 V. In addition, the TCP coil 410 and/or the electrode 420 may be comprised of two or more sub-coils or sub-electrodes, which may be powered by a single power supply or powered by multiple power supplies.

As shown in FIG. 4, the plasma processing system 400 further includes a gas source/gas supply mechanism 430. The gas source includes a main etch gas source 432, a passivation gas source 434, and optionally, an additional gas source 436. The main etch gas may have some of the same components as the passivation gas. In such a case, instead of having a separate main etch gas source and passivation gas source, the gas source provides various components of the main etch gas and passivation gas, as will be described below. The gas sources 432, 434, and 436 are in fluid connection with plasma processing chamber 404 through a gas inlet, such as a shower head 440. The gas inlet may be located in any advantageous location in plasma processing chamber 404, and may take any form for injecting gas. Preferably, however, the gas inlet may be configured to produce a "tunable" gas injection profile, which allows independent adjustment of the respective flow of the gases to multiple zones in the plasma processing chamber 404. The process gases and byproducts are removed from the chamber 404 via a pressure control valve 442 and a pump 444, which also serve to maintain a particular pressure within the plasma processing chamber 404. The gas source/gas supply mechanism 430 is controlled by the controller 424.

Figure 5:
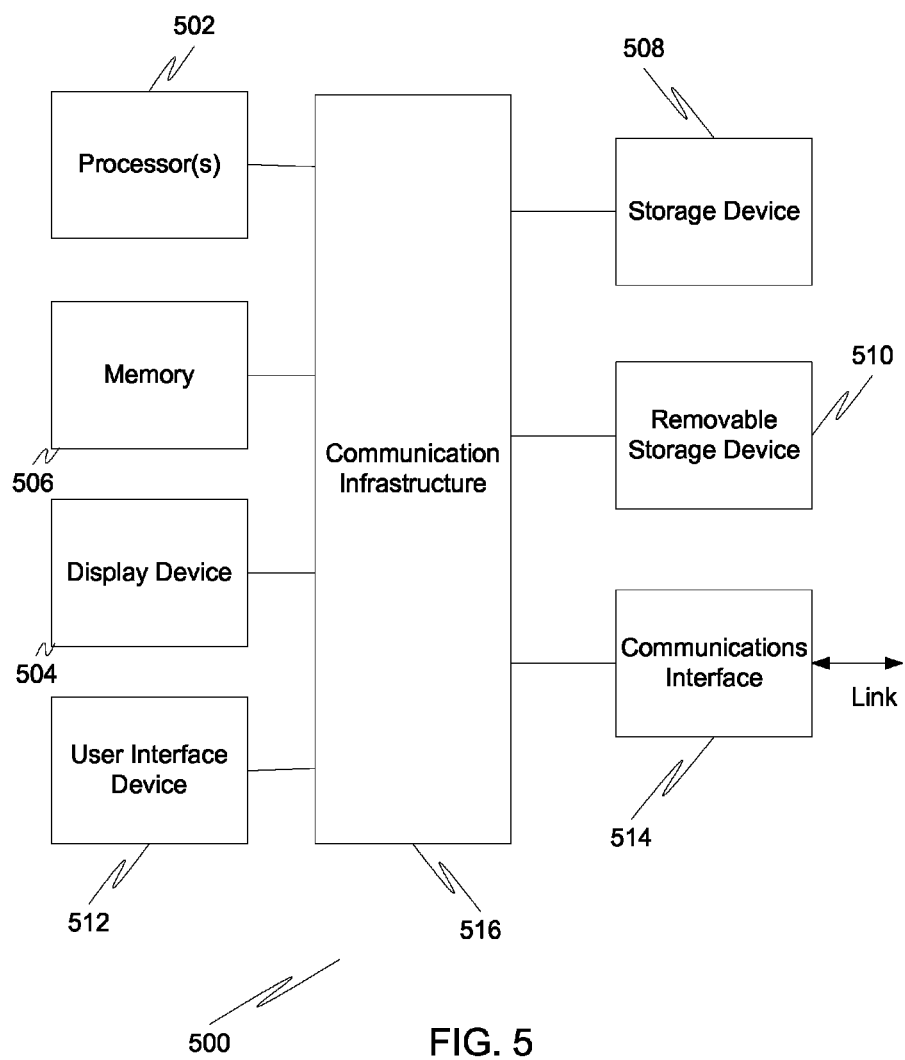
FIG. 5 illustrates a computer system, which is suitable for implementing a controller used in accordance with embodiments of the present invention.

FIG. 5 is a high level block diagram showing a computer system 500, which is suitable for implementing a controller, such as controller 424 of FIG. 4, used in embodiments of the present invention. The computer system may have many physical forms ranging from an integrated circuit, a printed circuit board, and a small handheld device, up to a huge super computer. The computer system 500 includes one or more processors 502, and further can include an electronic display device 504 (for displaying graphics, text, and other data), a main memory 506 (e.g., random access memory (RAM)), storage device 508 (e.g., hard disk drive), removable storage device 510 (e.g., optical disk drive), user interface devices 512 (e.g., keyboards, touch screens, keypads, mice or other pointing devices, etc.), and a communication interface 514 (e.g., wireless network interface). The communication interface 514 allows software and data to be transferred between the computer system 500 and external devices via a link. The system may also include a communications infrastructure 516 (e.g., a communications bus, cross-over bar, or network) to which the aforementioned devices/modules are connected.

Information transferred via communications interface 514 may be in the form of signals such as electronic, electromagnetic, optical, or other signals capable of being received by communications interface 514, via a communication link that carries signals and may be implemented using wire or cable, fiber optics, a phone line, a cellular phone link, a radio frequency link, and/or other communication channels. With such a communications interface, it is contemplated that the one or more processors 502 might receive information from a network, or might output information to the network in the course of performing the above-described method steps. Furthermore, method embodiments of the present invention may execute solely upon the processors or may execute over a network such as the Internet in conjunction with remote processors that shares a portion of the processing.

The term "non-transient computer readable medium" is used generally to refer to media such as main memory, secondary memory, removable storage, and storage devices, such as hard disks, flash memory, disk drive memory, CD-ROM and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 3B:
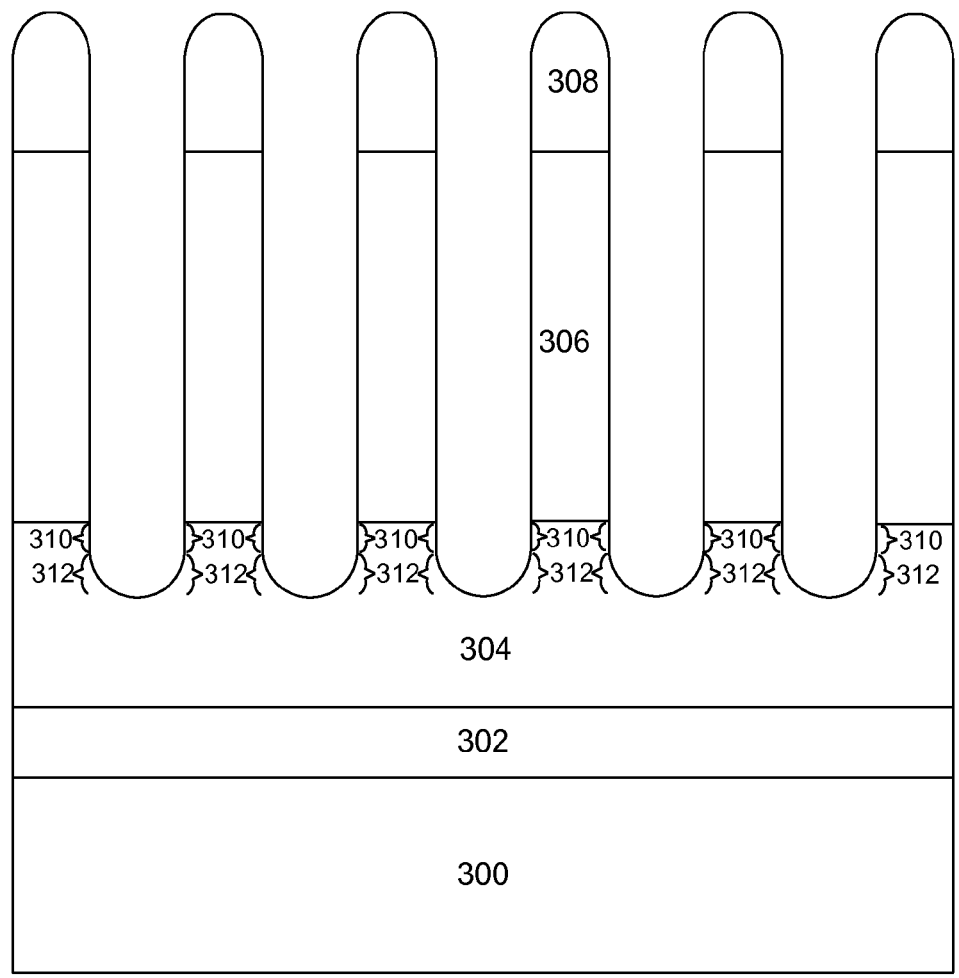

The tungsten layer is opened (step 104). In this example, 1000 watts at 13.6 MHz of RF power are provided by the TCP coil 410. A bias of 100 V is also provided and the plasma processing chamber 404 is set at 10 mTorr. The wafer is maintained at 100° C. An opening gas comprising 10 sccm $O_2$, 40 sccm $Cl_2$, and 60 sccm NF3, 50 sccm inert gases is provided to the plasma processing chamber 404. An inert gas is a gas which does not undergo a chemical reaction under a set of given conditions. For example, inert gases include noble gases such as argon and neon. The RF power transforms the opening gas into a plasma. Alternatively, 600 watts at 13.56 MHz of RF power are provided by the TCP coil 410. A pulsing bias from 0-850V is also provided at a pulsing frequency of 100 Hz with Bias ON for 15% and the processing chamber 404 is set at 5 mTorr. The wafer is maintained at 60° C. An opening gas comprising of 110 sccm CF4, 90 sccm O2 and 15 sccm NF3 is provided to the processing chamber. Accordingly, FIG. 3B illustrates an opened tungsten surface of the tungsten layer on the wafer of FIG. 3A, in accordance with an embodiment of the present invention. In particular, FIG. 3B includes substrate 300, etch stop layer 302, tungsten layer 304, first mask 306, second mask 308, first feature sidewalls 310, and first feature bottoms 312. More generally, the tungsten surface may be opened (step 104) by exposing tungsten layer 304 to opening components, such as perfluorocarbons (PFC's), $O_2$, $SF_6$, NF, $Cl_2$, etc. For example, a tungsten layer on the wafer may be opened by providing equal amounts of $Cl_2$ and $O_2$. The combination of $O_2$ and $Cl_2$, when exposed to the tungsten (W) surface, forms a volatile WOCl species that opens the tungsten. The result of this opening of tungsten layer 304 is the formation of sidewalls 310 and bottoms 312 of etched tungsten features.

Figure 2:
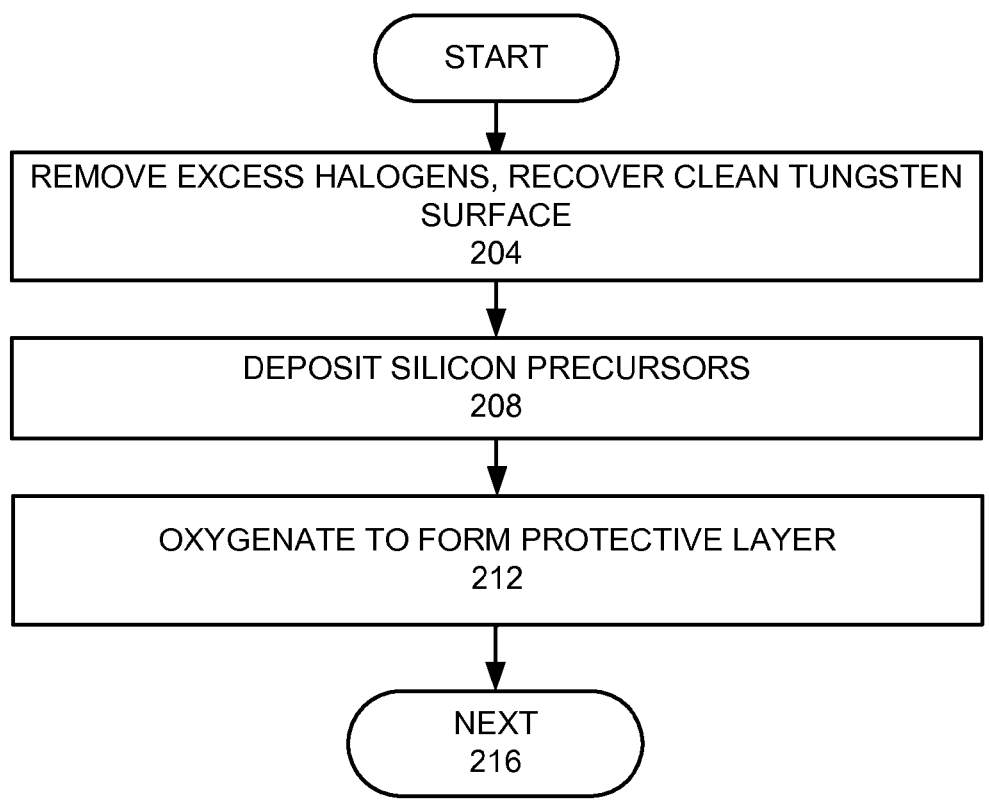
FIG. 2 is a flow chart of passivating an open tungsten layer, in accordance with embodiments of the present invention.

The open tungsten layer is passivated (step 108). In particular, FIG. 2 is a more detailed flow chart of passivating an open tungsten layer. In this embodiment, excess halogens are removed from an open tungsten layer (step 204). Halogens may have accumulated during the opening of the tungsten layer. Accordingly, prior to the formation of a passivation layer on the etched features on tungsten, a pre-deposition step may be performed to remove any excess radicals that have resulted from the opening process. In particular, if $Cl_2$ and $O_2$ are used to open tungsten, then the excess Cl atoms may remain on the surface, effectively forming a modified tungsten surface ($WCl_x$). Accordingly, a pre-deposition step may include exposing the modified tungsten surface to $SO_2$ plasma. The SO radicals of the $SO_2$ may react with the CY radicals to form volatile SOCl. Accordingly, the Cl atoms may be removed, returning the tungsten surface to its original condition. In this example, the pre-deposition step includes 1000 watts at 13.56 MHz of RF power that are provided by the TCP coil 410. A bias of 0 V is also provided and the plasma processing chamber 404 is set at 500 mTorr. The wafer is maintained at 120° C. A pre-deposition preparation gas comprising 2000 sccm $SO_2$, and 100 sccm inert gases is provided to the plasma processing chamber 404. The RF power may transform the pre-deposition preparation gas into a plasma or the pre-deposition preparation gas may be provided to the wafer in a gaseous form.

Figure 3C:
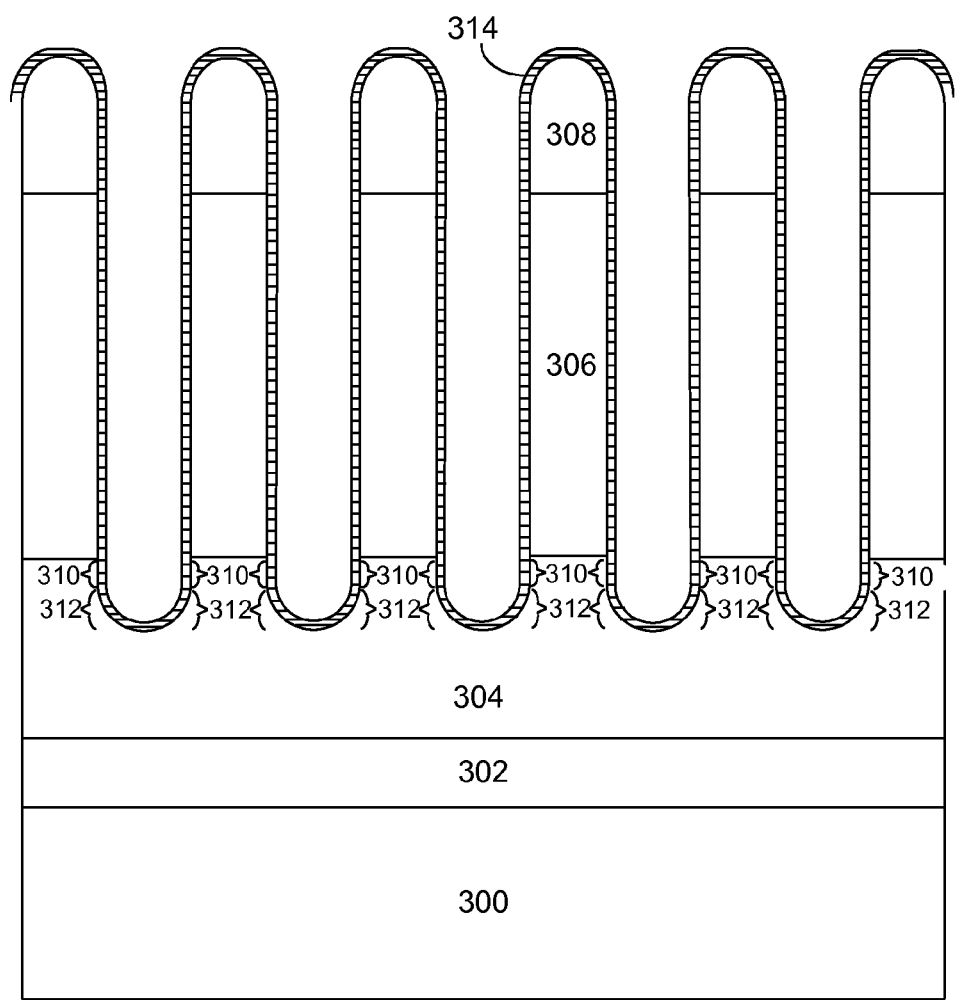

Once excess $Cl^-$ radicals have been removed from the tungsten layer, silicon precursors are deposited (step 208) on the tungsten layer. In particular, the silicon precursors are deposited on sidewalls of tungsten features in the tungsten layer. The silicon precursors are adsorbed to the sidewalls. In particular, the tungsten layer may be exposed to a silicon precursor, such as $SiCl_4$. In this example, 1000 watts at 13.56 MHz of RF power are provided by the TCP coil 410. The plasma processing chamber 404 is set at 50 mTorr. The wafer is maintained at 120° C. A silicon precursor gas comprising 100 sccm $SiCl_4$ is provided to the plasma processing chamber 404. In particular, the silicon precursor gas is provided to the plasma processing chamber 404 in a gaseous form so as to allow for uniform distribution across the exposed areas of the tungsten layer. Accordingly, FIG. 3C illustrates a silicon precursor deposited on the opened tungsten surface of the tungsten layer on the wafer of FIG. 3B, in accordance with embodiments of the present invention. In particular, FIG. 3C includes substrate 300, etch stop layer 302, tungsten layer 304, first mask 306, second mask 308, first feature sidewalls 310, first feature bottoms 312, and silicon precursor layer 314. In particular, silicon precursor layer 314 includes $SiCl_4$ that has adsorbed to exposed areas of the etched tungsten surface.

Other examples of a silicon precursor that may be used include $SiF_4$, $SiCO_4$, $SiH_4$, disilane, etc, or a combination of silicon precursors thereof. The silicon precursor may be adsorbed to the exposed areas of the etched tungsten features. In particular, the silicon precursor may be adsorbed to the exposed areas of the etched tungsten features using a gaseous distribution, allowing the silicon precursor to be adsorbed in a uniform manner. Further, the silicon precursor is provided in gaseous form. In embodiments, the silicon precursor may be mixed with inerts, such as He, Ar, $N_2$, etc.

Figure 3D:
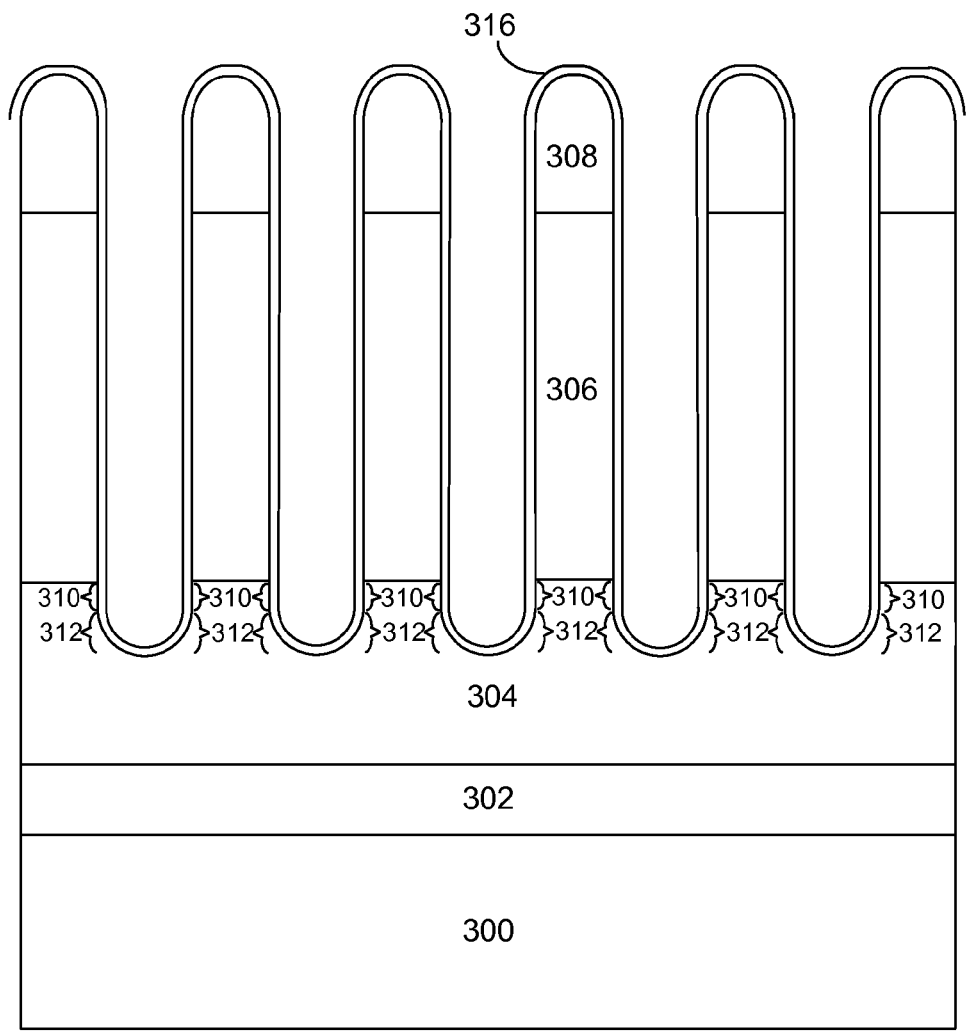

Further, the silicon precursors are oxygenated to form a protective layer (step 212). During the oxygenating step, excess halogens are scavenged by the oxygenating plasma. As such, the oxygenating plasma is a halogen scavenger. The oxygenating plasma also oxygenates the silicon component of the silicon precursors that are adsorbed to the tungsten features. Accordingly, after the silicon precursor has been adsorbed to the surface of the exposed areas of the etched tungsten features, an oxidizing plasma is provided. In this example, 1000 watts at 13.6 MHz of RF power are provided by the TCP coil 410. The plasma processing chamber 404 is set at 50 mTorr. The wafer is maintained at 120° C. An oxygenating gas comprising 200 sccm $SO_2$, and 100 sccm inert gases is provided to the plasma processing chamber 404. Additionally, the RF power transforms the oxygenating gas into a plasma. Accordingly, FIG. 3D illustrates the oxidated silicon precursor deposited on the tungsten layer on the wafer of FIG. 3C, in accordance with embodiments of the present invention. In particular, FIG. 3D includes substrate 300, etch stop layer 302, tungsten layer 304, first mask 306, second mask 308, first feature sidewalls 310, first feature bottoms 312, and the oxygenated layer 316. In particular, FIG. 3D illustrates oxygenated layer 316 that results when the silicon precursor layer 314 of FIG. 3C is oxygenated using an oxygenating plasma such as $SO_2$.

In this example, silicon precursor layer 314 is $SiCl_4$. In particular, O radicals will react with the $SiCl_x$ adsorbed to the exposed areas to form a silicon oxide such as $SiO_x$, where "x" may vary. As such, the oxidizing plasma oxidizes the silicon precursor and also scavenges the excess $Cl^-$ radicals that result from the oxidation of the silicon precursor. The characteristic of the oxidizing plasma to scavenge the $Cl^-$ radicals prevents the $Cl^-$ radicals from forming a volatile etching component such as WOCl. Further, the oxidizing plasma interacts with the adsorbed silicon precursor at the surface of the tungsten features. This allows for the uniform formation of a passivation layer. In particular, since the silicon precursor layer is uniformly adsorbed to the surface of the etched tungsten features, the resulting oxidation at the points of adsorption is similarly uniform. Further, the formation of the $SiO_x$ passivation layer may be tuned by controlling the pressure, temperature, and/or dosage of the components. As such, the deposited film may be adjusted to aid in loading control. For example, a thicker film may be deposited in the open/perimeter areas and a thinner film may be deposited in the isolated or dense/array areas. This tunable deposition loading helps to achieve a tunable etch/loading control between dense and isolated features.

Once the passivation layer has been formed, a next (step 216) breakthrough process may be used to clear the deposited film from the open front (step 112), thereby opening it for subsequent etch step. This breakthrough process does not attack the sidewalls, but only the open front, as it is a very directional process. In discussed embodiments, the open front is at the bottom of the etched tungsten features. In further embodiments, however, the open front may refer to an area that is desired to be etched in the features. As such, in embodiments, an open front may be formed on a portion of a sidewall that is not desired to be protected.

Figure 3E:
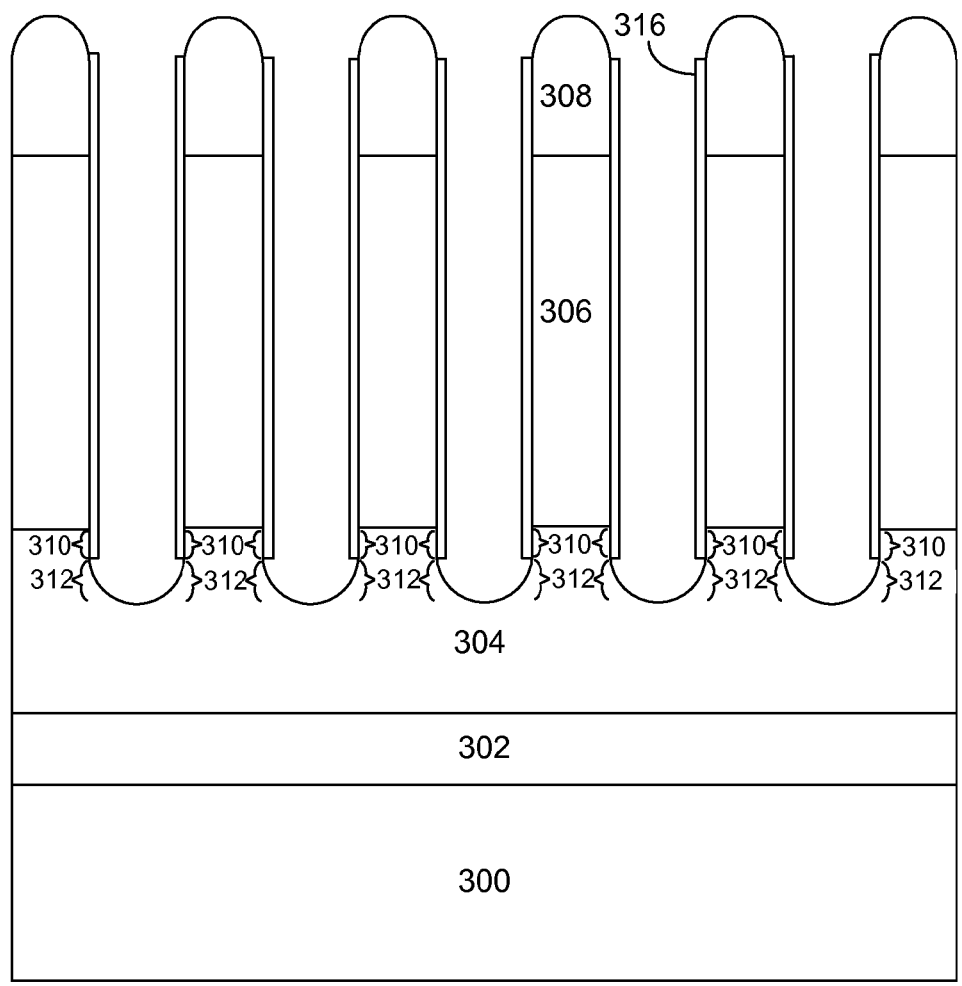

In this example, 600 watts at 13.6 MHz of RF power are provided by the TCP coil 410. A bias of 850 V is also provided and the plasma processing chamber 404 is set at 10 mTorr. The wafer is maintained at 120° C. A breakthrough gas comprising, 100 sccm $Cl_2$ is provided to the plasma processing chamber 404. Additionally, the RF power transforms the breakthrough gas into a plasma. Accordingly, FIG. 3E illustrates a breakthrough openings on a tungsten surface of the tungsten layer on the wafer of FIG. 3D, in accordance with embodiments of the present invention. In particular, FIG. 3E includes substrate 300, etch stop layer 302, tungsten layer 304, first mask 306, second mask 308, first feature sidewalls 310, first feature bottoms 312, and oxygenated layer 316. As seen in FIG. 3E, portions of oxygenated layer 316 have been removed from first feature bottoms 312 as compared to FIG. 3D. In particular, vertical components of the etched features (e.g., first feature sidewalls 310) have retained coverage from the oxygenated layer 316. Accordingly, these portions of the features are protected against etching. However, horizontal components of the etched features (e.g., first feature bottoms 312) have had the oxygenated layer 316 removed so as to allow for etching components to deepen the features. In further embodiments, a breakthrough process is not needed—rather, an increased bias is used in etching so as to control the directionality of the etch to avoid etching the sidewalls.

With the open front opened to expose the tungsten underneath, and with the sidewalls now protected by the deposited $SiO_x$ film, etching (step 116) can be continued with the etch chemistry ($CF_4$, PFC's, $O_2$, $SF_6$, $NF_3$, $Cl_2$, COS, etc). A series of cycles using this cyclic deposition/passivation, breakthrough, and etch steps leads to tunable sidewall profiles, CD, and loading controls. This process can be accomplished using the MMP process as described herein for high throughput in production.

Figure 3F:
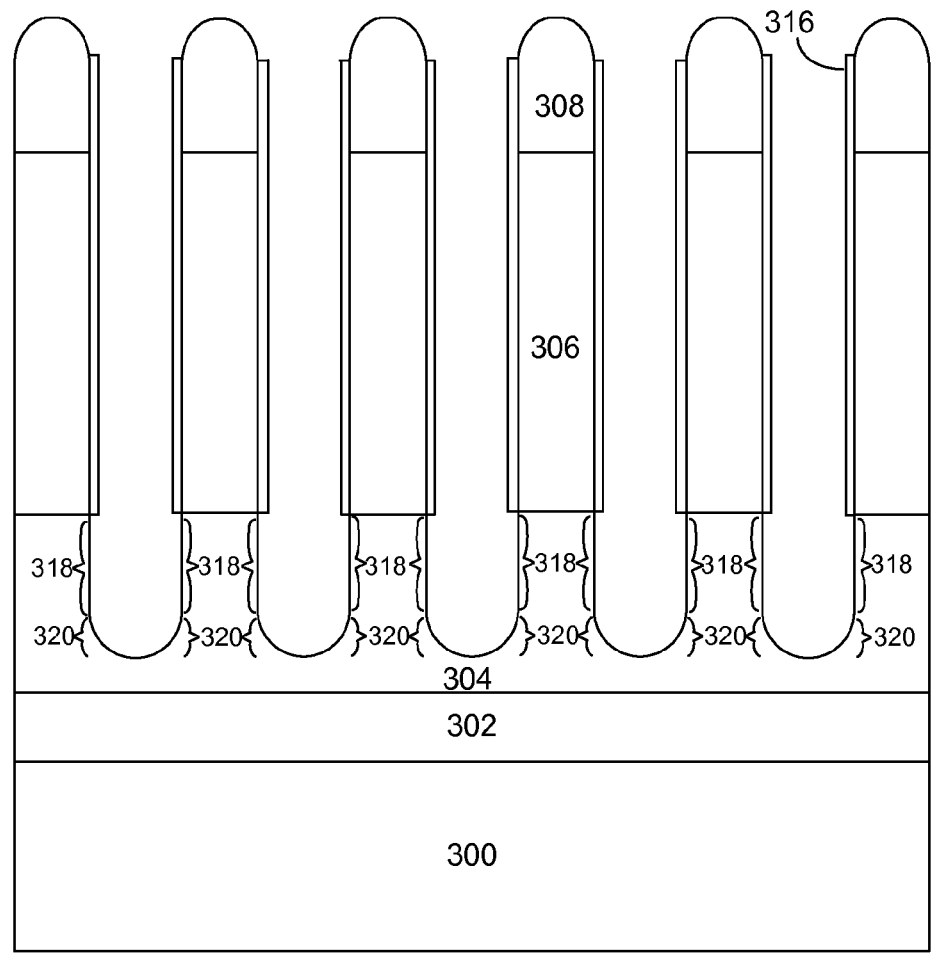

As such, FIG. 3F illustrates etched features of the opened tungsten surface of the tungsten layer on the wafer of FIG. 3E, in accordance with embodiments of the present invention. In particular, FIG. 3F includes substrate 300, etch stop layer 302, tungsten layer 304, first mask 306, second mask 308, second feature sidewalls 318, and second feature bottoms 320. As seen in FIG. 3F, second feature sidewalls 318 are longer than first feature sidewalls 310. This is due to the deepening of the features in tungsten layer 304. Further, second feature bottoms 320 have been displaced closer to etch stop layer 302 compared to first feature bottoms 312. This is due to the cyclic nature of the passivation-etching steps. In particular, the cycle of passivation-etching steps will continue until the bottoms of the features reaches etch stop layer 302. In particular, there is determination of whether the etch stop layer 302 has been reached (step 120). If there is a determination that the etch stop layer 302 has been reached, the process stops (step 124). However, if there is a determination that the etch stop layer 302 has not been reached, then the process cycles back to the beginning of the passivation-etching steps, starting at step 108.

Figure 3G:
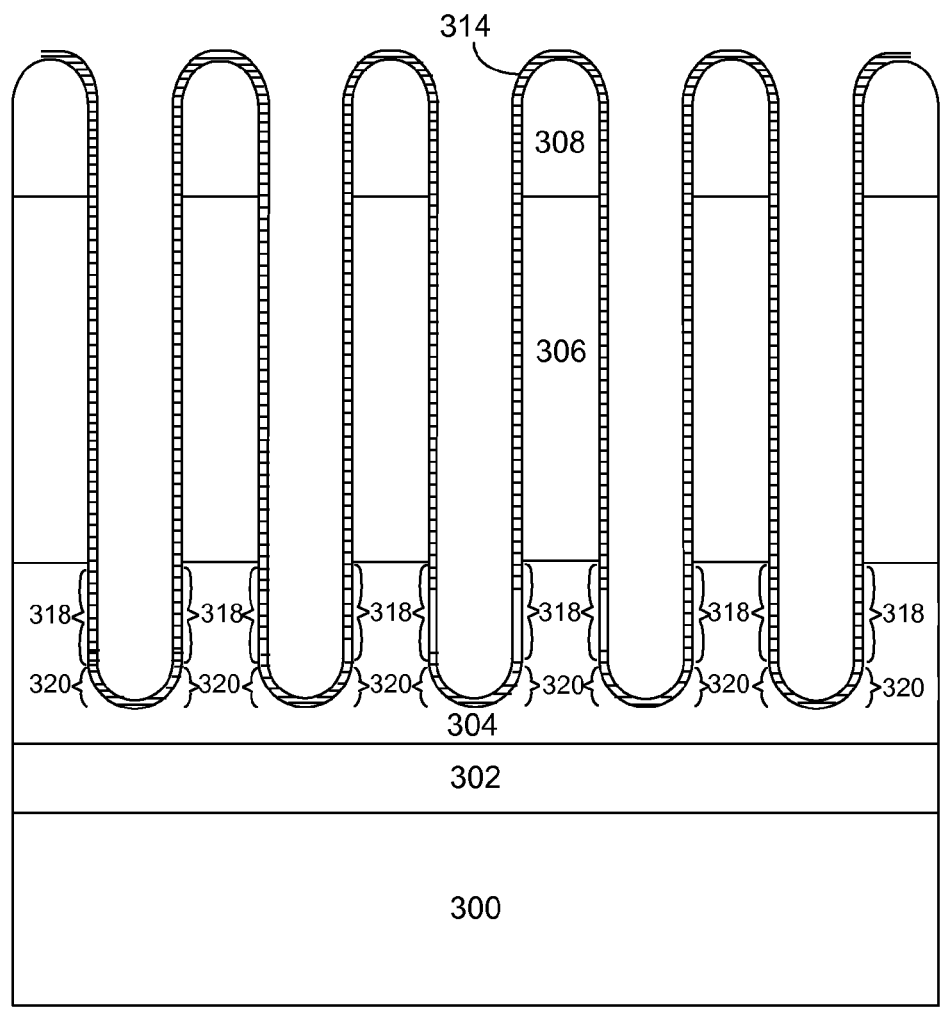

In this example, 600 watts at 13.6 MHz of RF power are provided by the TCP coil 410. A bias of 100 V is also provided and the plasma processing chamber 404 is set at 10 mTorr. The wafer is maintained at 100° C. An etching gas comprising 30 sccm $O_2$, 40 sccm $Cl_2$, 60 sccm NF3, and 100 sccm inert gases is provided to the plasma processing chamber 404. Additionally, the RF power transforms the etching gas into a plasma. FIG. 3G illustrates a silicon precursor adsorbed to the etched tungsten layer on the wafer of FIG. 3F, in accordance with embodiments of the present invention. In particular, FIG. 3G includes substrate 300, etch stop layer 302, tungsten layer 304, first mask 306, second mask 308, second feature sidewalls 318, second feature bottoms 320, and silicon precursor layer 314. Similar to the formation seen in FIG. 3C, a silicon precursor is adsorbed into exposed areas of the etched tungsten features. The silicon precursor may be adsorbed in a monolayer. Alternatively, the silicon precursor may be adsorbed as multiple layers. Accordingly, second feature sidewalls 318 and second feature bottoms 320 have silicon precursors adsorbed therein.

Figure 3H:
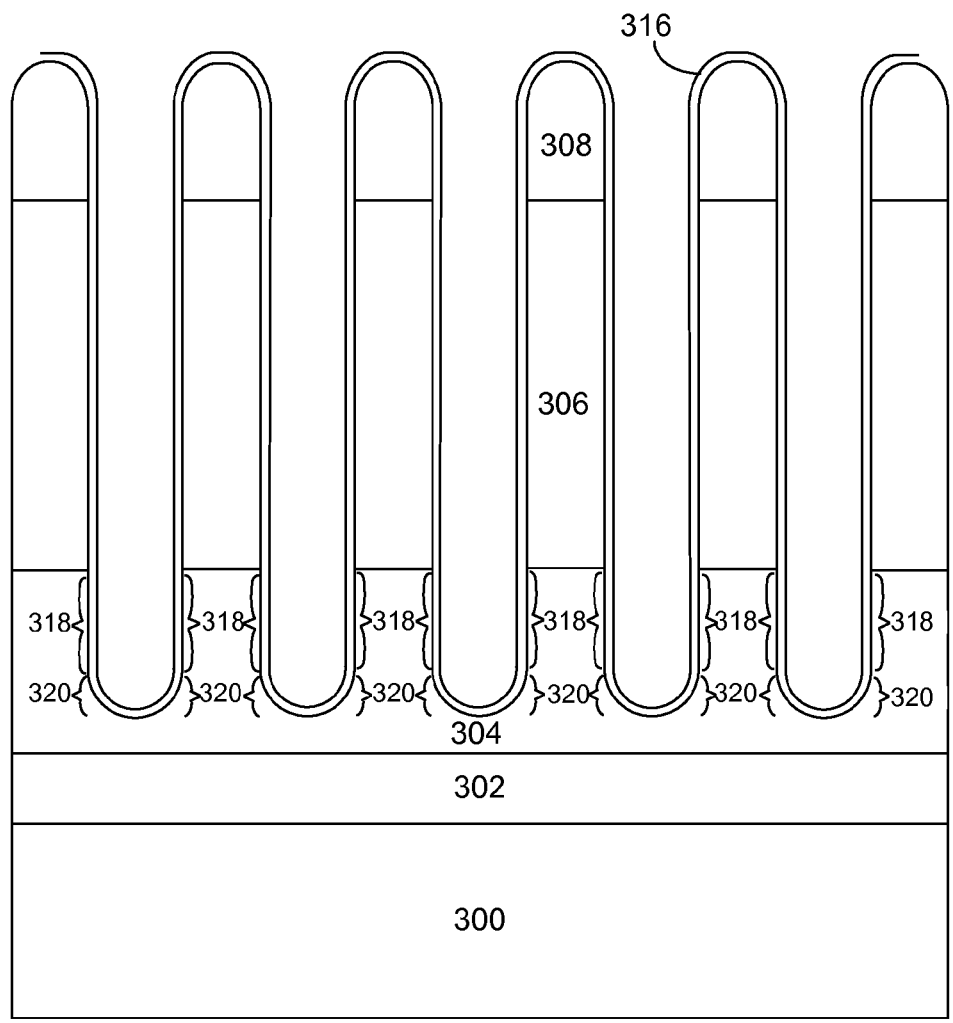

FIG. 3H illustrates oxidized silicon precursor, such as the adsorbed silicon precursor shown in FIG. 3G, in accordance with embodiments of the present invention. In particular, FIG. 3H includes substrate 300, etch stop layer 302, tungsten layer 304, first mask 306, second mask 308, second feature sidewalls 318, second feature bottoms 320, and oxygenated layer 316. In particular, an oxygenating plasma is provided to the features. In particular, an oxygenated plasma is a plasma generated from an oxygen source. Some of the oxygen sources are $SO_2$, $CO_2$, COS, $O_2$. The oxygenating plasma works to oxidize the silicon precursor as well as to scavenge excess radicals formed from the oxidization. Accordingly, a passivation layer is formed across second feature sidewalls 320 and second feature bottoms 318.

Figure 3I:
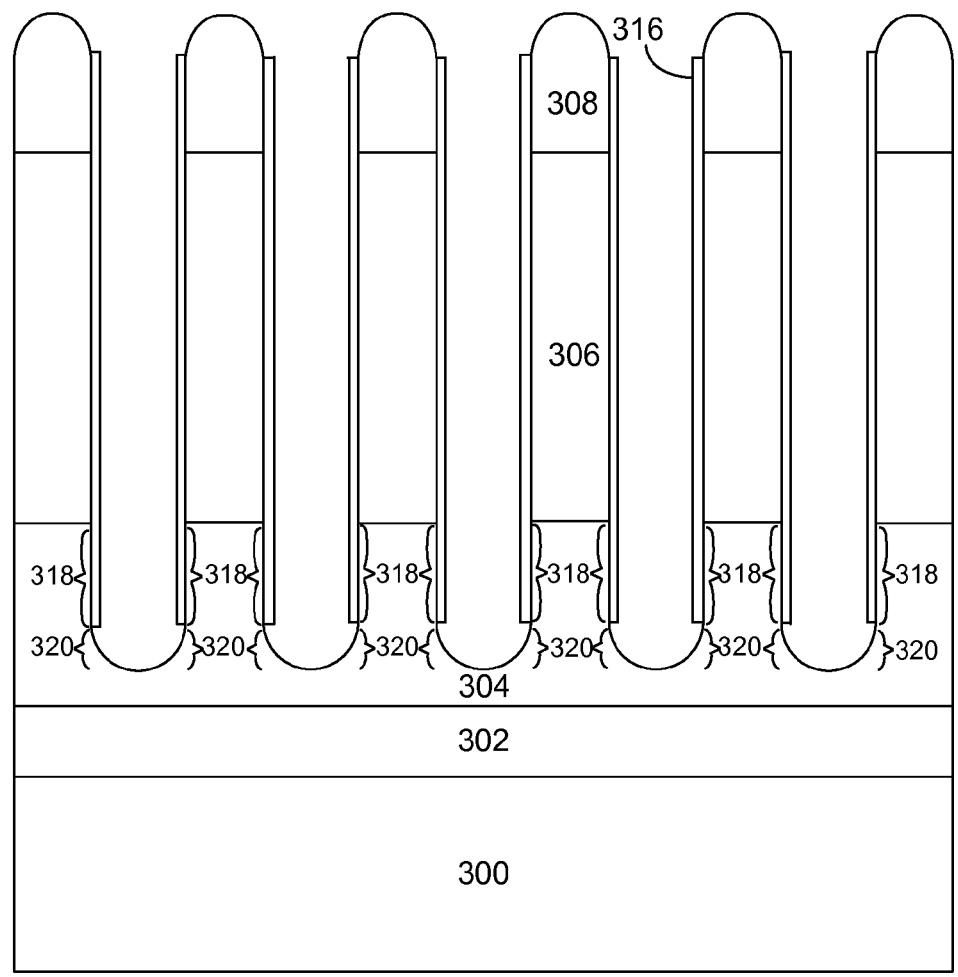

FIG. 3I illustrates openings of a tungsten surface of the tungsten layer on the wafer of FIG. 3H, in accordance with embodiments of the present invention. In particular, FIG. 3I includes substrate 300, etch stop layer 302, tungsten layer 304, first mask 306, second mask 308, second feature sidewalls 318, second feature bottoms 320, and oxygenated layer 316. As seen in FIG. 3E, vertical aspects of the features have the passivation layer preserved, whereas horizontal components have the passivation layer removed so as to allow for further etching.

The embodiments as described provide formation of a passivation layer over etched tungsten features. In particular, the passivation chemistry that is used to form a passivation layer on the etched tungsten features is distinct from the passivation chemistry that may be used on other materials, such as silicon. In particular, prior to the present invention, there has been no known passivation chemistry that forms a passivation layer on etched tungsten. While there was a prior passivation chemistry for forming a passivation layer on silicon, the method used does not result in the formation of a passivation layer on etched tungsten. Rather, the prior method utilized $SiCl_4$ that was oxidized using $O_2$, which resulted in excess $Cl^-$ and O radicals that reacted with W to form WOCl, a volatile species that etches tungsten. Accordingly, in order to form a passivation layer on etched tungsten, an approach was needed that would avoid the formation of etching species, such as WOCl. As such, methods provided herein provide an oxidizing plasma that is able to scavenge excess ions, such as $Cl^-$, that may result from the oxidation of a silicon precursor. Preferably, the steps of the first embodiment of the MMP process (passivation, breakthrough, and main etch) are not simultaneous. Rather, they are performed sequentially. Additionally, the steps of the second embodiment of the MMP process (passivation, main etch) are also not simultaneous. Rather, they are performed sequentially.

While this invention has been described in terms of several preferred embodiments, there are alterations, permutations, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method for etching a tungsten containing layer in an etch chamber, comprising:
   placing a substrate with a tungsten containing layer in the etch chamber;
   provide a plurality of cycles, wherein each cycle comprises:
      a passivation phase for forming a passivation layer of silicon oxide on sidewalls and bottoms of features in the tungsten containing layer; and
      an etch phase for etching features in the tungsten containing layer.

2. The method, as recited in claim 1, wherein the passivation phase comprises:
   adsorbing a silicon precursor into the sidewalls of the features in the tungsten containing layer; and
   exposing the tungsten containing layer to a plasma that scavenges Cl from the sidewalls.

3. The method, as recited in claim 2, wherein the silicon precursor is $SiCl_x$, where x is an integer between 1 and 4.

4. The method, as recited in claim 2, wherein the adsorbing the silicon precursor into the sidewalls comprises:
   providing an adsorption gas comprising $SiCl_4$;
   forming the adsorption gas into a plasma.

5. The method, as recited in claim 2, wherein the silicon precursor is mixed with at least one inert gas.

6. The method, as recited in claim 2, wherein the exposing the tungsten containing layer to a plasma that scavenges Cl from the sidewalls, comprises:
   providing a scavenger gas comprising $SO_2$; and
   forming the scavenger gas into a plasma.

7. The method, as recited in claim 1, wherein the passivation layer is etched more slowly than the tungsten containing layer.

8. The method, as recited in claim 1, wherein the plurality of cycles further comprises an opening phase for opening the tungsten containing layer.

9. The method, as recited in claim 8, wherein the opening phase comprises exposing the tungsten containing layer to at least one of perfluorocarbons, $O_2$, $SF_6$, NF, and $Cl_2$.

10. A method for forming a passivation layer on sidewalls of etched tungsten features, the method comprising:
    forming etched features in a tungsten layer of a wafer, the etched features having sidewalls;
    adsorbing a silicon precursor to the sidewalls; and
    subsequent to the step of absorbing, oxygenating the silicon precursor adsorbed to the sidewalls;
    wherein the silicon recursor is oxygenated using a plasma that contains $SO_2$ and $O_2$.

11. The method, as recited in claim 10, wherein the silicon precursor is halogenated.

12. The method, as recited in claim 10, wherein the plasma scavenges halogen radicals.

13. The method, as recited in claim 12, wherein the halogen radicals are generated during the oxygenating of the silicon precursor.

14. The method, as recited in claim 1, wherein the etch phase is subsequent to the passivation phase in each cycle.

* * * * *